United States Patent [19]

Brower

[11] 4,444,552
[45] Apr. 24, 1984

[54] SUBMINIATURE ARRAY CIRCUITRY

[75] Inventor: Boyd G. Brower, Williamsport, Pa.

[73] Assignee: GTE Products Corporation, Stamford, Conn.

[21] Appl. No.: 365,057

[22] Filed: Apr. 2, 1982

[51] Int. Cl.³ .............................................. F21K 5/00
[52] U.S. Cl. ...................................... 431/359; 362/13
[58] Field of Search .............. 431/357, 358, 359, 364, 431/365; 362/13, 15, 11; 354/145

[56] References Cited

U.S. PATENT DOCUMENTS

| 3,473,880 | 10/1969 | Wick | 431/359 |
| 4,164,007 | 8/1979 | Audesse et al. | 362/13 |
| 4,375,953 | 3/1983 | Bouchard et al. | 431/359 |

Primary Examiner—Samuel Scott
Assistant Examiner—Randall L. Green
Attorney, Agent, or Firm—Thomas H. Buffton

[57] ABSTRACT

A miniaturized multilamp photoflash array having a circuit board with a printed circuit thereon and a multiplicity of flashlamps electrically connected to the printed circuit with a continuous strip of switching material forming a plurality of switches coupling each of the lamps to a common circuit.

10 Claims, 3 Drawing Figures

SUBMINIATURE ARRAY CIRCUITRY

CROSS-REFERENCE TO OTHER APPLICATIONS

A concurrently filed application entitled "Subminiature Array With Normally Closed (N/C) And Normally Open (N/O) Switches" in the name of the present inventor and assigned to the assignee of the present invention relates to circuitry for switching a common or ground conductor and an energizing conductor.

TECHNICAL FIELD

This invention relates to miniature and subminiature multilamp photoflash arrays and more particularly to miniature multilamp photoflash arrays having a plurality of normally closed switches formed from a continuous strip of electrically conductive switch material.

BACKGROUND ART

Generally, it is known that fabricating so called "printed circuits" by a die-stamping technique, rather than the well known etching process, is more efficient and provides a product of improved quality at reduced cost in labor and materials. Also, it is known that miniature and subminiature photoflash arrays are severely restricted insofar as space for both circuitry paths and components of the printed circuit are concerned. Thus, a photoflash array adapted to die-stamping circuit fabrication and improved space for circuitry and components represents a desired goal for miniature structures.

One known printed circuit design for a photoflash array is set forth in a pending application bearing U.S. Ser. No. 277,797, filed June 29, 1981, and assigned to the assignee of the present application. Herein, the printed circuit has a common circuit forming the perimeter of the circuit board. Although such structures are not especially troublesome when the printed circuit is effected by an etching process, there are problems when die-stamping is emloyed. More specifically, a common circuit perimeter of the circuit board inhibits the removal of scrap material in a die-stamp operation since there are no free edges of scrap for grasping and thereby applying a removing force to the scrap material.

Also, the problems associated with limited space and miniaturized components is set forth in a pending application bearing U.S. Ser. No. 325,068, filed Nov. 25, 1981, and assigned to the assignee of the present application. Herein, the array utilizes a plurality of normally closed switches and clearly sets forth the problems associated with handling and fabricating these individual switches. Moreover, the suggested structure also includes so called "blind" sections wherein the scrap from a die-stamp operation must be pulled in an opposite direction for removal.

OBJECTS AND SUMMARY OF THE INVENTION

An object of the present invention is to provide an enhanced miniaturized multilamp photoflash array. Another object of the invention is to provide a multilamp photoflash array having improved switching capabilities. Still another object of the invention is to maximize the space utilization of normally closed switching and circuit path componentry in a photoflash array. A further object of the invention is to provide a photoflash array having multiple switches and multiple energy return paths.

These and other objects, advantages and capabilities are achieved in one aspect of the invention wherein a miniaturized photoflash array has a printed circuit with a plurality of flashlamps each having a pair of electrically conductive leads affixed to the printed circuit and a continuous strip of switch material providing an energy path to a plurality of normally closed switches.

BEST MODE FOR CARRYING OUT THE INVENTION

For a better understanding of the present invention, together with other and further objects, advantages and capabilities thereof, reference is made to the following disclosure and appended claims in conjunction with the accompanying drawings.

Figure 1:
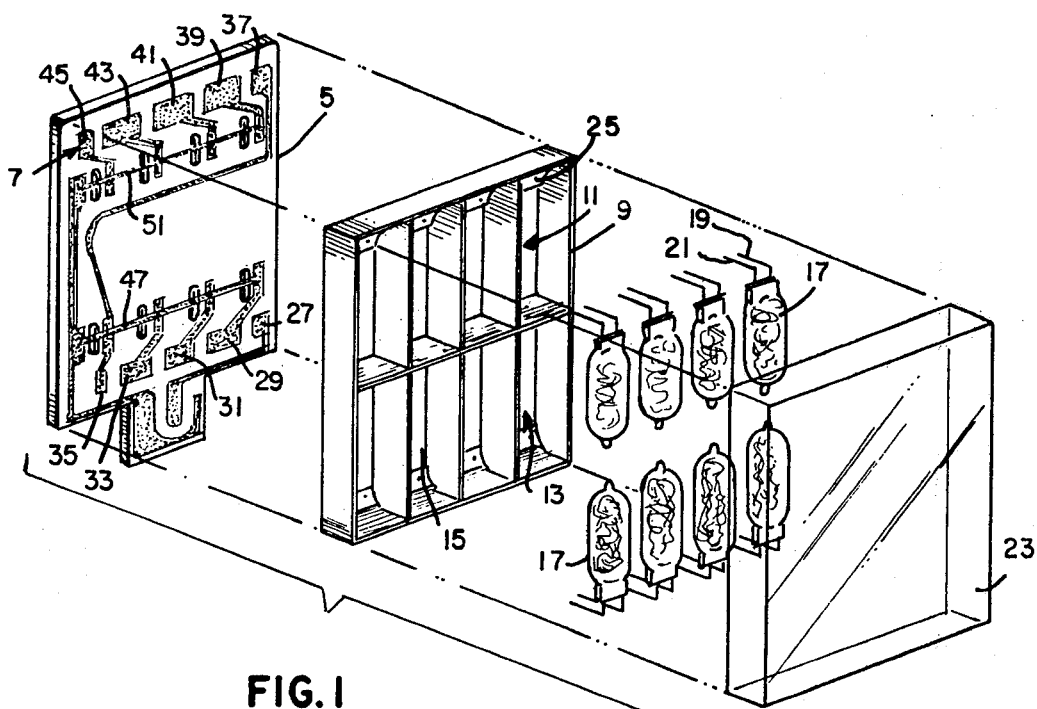
FIG. 1 is an exploded isometric view of a preferred form of miniaturized multilamp photoflash array.

Referring to the drawings, FIG. 1 sets forth a miniaturized multilamp photoflash array having a circuit board 5 having a printed circuit 7 disposed on the inner surface thereof. A reflector unit 9 has first and second rows, 11 and 13 respectively, of a plurality of cavities 15. The cavities 15 are preferably, not necessarily, of an open-back configuration, and the reflector unit 9 is affixed to the circuit board 5.

A plurality of flashlamps 17, each having a pair of electrically conductive leads 19 and 21, are arrayed in rows with one of the flashlamps 17 nested within each one of the cavities 15 of the reflector unit 9. The electrically conductive leads 19 and 21 of each of the flashlamps 17 are affixed to the printed circuit 7. Also, a light transmittable plastic cover member 23 encloses the flashlamps 17, reflector unit 9, printed circuit 7 and is attached to the circuit board 5.

Figure 2:
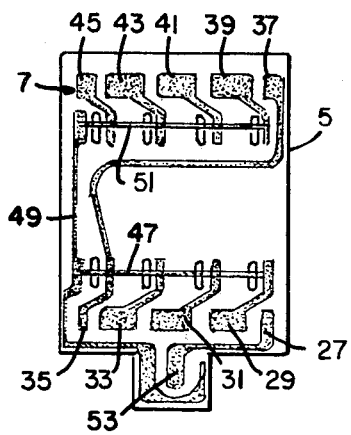
FIG. 2 illustrates the preferred printed circuit and switch arrangement of FIG. 1.

Referring to FIG. 2 of the drawings, the reflector unit 9 of FIG. 1 also includes a plurality of spaced apertures 25 formed to receive the leads 19 and 21 of the flashlamps 17. Each of the leads 19 and 21 passes through one of the apertures 25 and is electrically connected to the printed circuit 7. Also, the printed circuit 7 includes a first row of circuit pads 27–35 and a second row of circuit pads 37–45.

A first strip of switching material 47 interconnects the circuit pads 29 through 35 and is coupled to a common or ground conductor 49. Similarly, a second strip of switching material 51 interconnects the circuit pads 39 through 45 and is coupled to the same common or ground conductor 49. Moreover, an energizing source (not shown) is connectable to the circuit pad 27 by way of an electrically conductive path 53.

Figure 3:
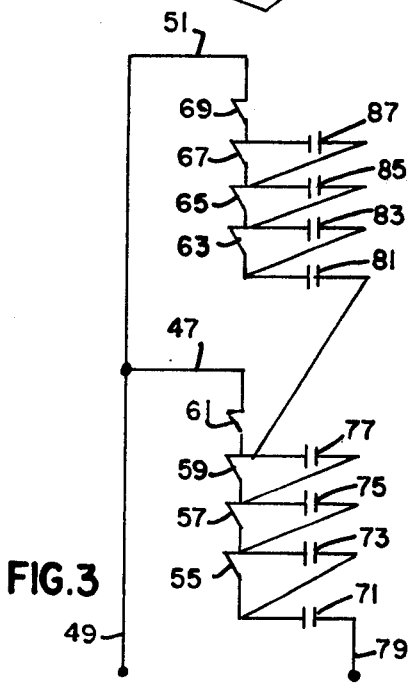
FIG. 3 is a schematic illustration of the lamp and switch array of FIG. 1.

As can be seen more clearly in the schematic illustration of FIG. 3, the previously mentioned first strip of switching material 47 as well as the second strip of switching material 51 are both connected to the common or ground connector 49. A plurality of normally closed (N/C) switches 55, 57, 59 and 61 are series connected to the common or ground circuit 49. Similarly, a second group of normally closed (N/C) switches 63, 65, 67 and 69 are series connected to the ground circuit 49.

A first row of flashlamps 71, 73, 75 and 77 are serially connected to an energizing lead 79 and to the strip of switching material 47 coupled to the ground connector 49. Also, a second row of flashlamps 81, 83, 85 and 87 are serially connected to the energizing lead 79 by way of the flashlamps 71, 73, 75 and 77 and to the second strip of switching material 51. Thus, it can be seen that each of the flashlamps 71, 73, 75, and 77 has one return path to the common ground 49 by way of the normally closed (N/C) switches 55, 57, 59 and 61 and another return path by way of the series connected flashlamps 73, 75 and 77 and the switch 61. Similarly, the flashlamps 81, 83, 85 and 87 have a return path to common ground 49 by way of the switch material 51 and the series connected switches 63, 65, 67 and 69 or the flashlamps 83, 85 and 87 and the switch 69.

As to operation, application of a pulse potential to the energizing lead 79 causes activation of the flashlamp 71 which is coupled by way of the normally closed (N/C) switches 55-61 to the common ground 49. Thereupon, the normally closed (N/C) switch 55 is converted to an open condition and the flashlamp 55 is converted to a short-circuit condition. Thus, a following pulse potential is applied by way of the short-circuited flashlamp 71 to a following flashlamp 73. Also, the common ground is disconnected from the flashlamp 71 due to the open condition of the switch 55. As a result, the flashlamps 71-77 and 81-87 are sequentially operated by succeeding pulses of potential applied to the energizing lead 79.

It is to be noted that the strips of switching material 47 and 51 each provide a plurality of series connected normally closed (N/C) switches 55-61 and 63-69. Also, each of the flashlamps 71-77 and 81-87 is connected to the common ground 49 by way of the switches 55-61 and 63-69 and the switch material strips 47 and 51. Thus, the tendency toward undesired electrostatic flashing is reduced.

Further, it is noted that each of the flashlamps 71-77 and 81-87 have two paths to the common ground 49, i.e., one via the switches 55-61 and 63-69 and the other via the lamps 73-77 and 81-87. However, it should further be noted that the resistivity of the lamps 71-77 and 81-87 is of a value greater than that of the switches 55-61 and 63-69 in order to prevent multiple flashes of the flashlamps.

Thus, the above-described switching material serves as a replacement for common circuit runs. The switching material utilizes a continuous strip for a multiplicity of switches and provides, in conjunction with the lamps, multiple energy routes to a common ground connection. Also, each lamp is connected to a common ground inhibiting undesired electrostatic flashing and the switching material provides low ohmic contacts whereby multiple lamp flashing is inhibited.

While there has been shown and described what is at present considered the preferred embodiments of the invention, it will be obvious to those skilled in the art that various changes and modifications may be made therein without departing from the invention as defined by the appended claims.

INDUSTRIAL APPLICABILITY

An improved miniature multilamp photoflash array utilizes a continuous strip of switching material to provide a plurality of normally closed (N/C) switches. The cost and efficiency of switch manufacture is greatly enhanced and the probabilities of undesired electrostatic flashing are greatly reduced.

I claim:

1. A miniaturized multilamp photoflash array having a support member with a printed circuit on the inner surface thereof and a plurality of flashlamps each having a pair of electrically conductive leads affixed to said printed circuit, said array characterized by the improvement wherein a plurality of flashlamps are connected to a common conductor by a continuous strip of switching material forming a plurality of series-connected normally-closed switches.

2. The improvement of claim 1 wherein said continuous strip of switching material provides an electrically conductive path.

3. The improvement of claim 1 wherein said plurality of flashlamps are arrayed in two rows and a continuous strip of switching materials connects said flashlamps in each of said two rows to a common conductor.

4. The improvement of claim 1 wherein said continuous strip of switching material provides a plurality of normally closed (N/C) switches each having a breakdown voltage less than the breakdown voltage of a flashlamp.

5. The improvement of claim 1 wherein all of the connections to said plurality of flashlamps are connected to circuit ground except the flashlamp being activated.

6. A miniaturized multilamp photoflash array having a circuit board with a printed circuit on one surface thereof, a plurality of flashlamps arrayed in first and second rows with each of said flashlamps having a pair of electrically conductive leads connected to said printed circuit and a continuous strip of switching material coupling all of the connections except one of said plurality of lamps to a common ground and forming a plurality of series-connected normally-closed switches.

7. The miniaturized multilamp photoflash array of claim 6 wherein each of said lamps has two alternate routes to a common connection.

8. The miniaturized multilamp photoflash array of claim 6 wherein all except one of said flashlamps is connected to a comnon circuit through a normally closed (N/C) switch.

9. The miniaturized multilamp photoflash array of claim 6 wherein each of said flashlamps has a return route to a common connection by way of a normally closed (N/C) switch and by way of another flashlamp.

10. The miniaturized multilamp photoflash array of claim 9 wherein said normally closed (N/C) switch is of a resistive value less than the resistive value of a flashlamp.

* * * * *